United States Patent
Rivoir

(12) 
(10) Patent No.: US 6,462,693 B1
(45) Date of Patent: Oct. 8, 2002

(54) ANALOG TO DIGITAL SIGNAL CONVERSION METHOD AND APPARATUS

(75) Inventor: Jochen Rivoir, Sunnyvale, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/875,848

(22) Filed: Jun. 6, 2001

(51) Int. Cl.[7] ................................................ H03M 1/12
(52) U.S. Cl. ...................... 341/155; 341/159; 340/347
(58) Field of Search ................................ 341/155, 156, 341/158, 159, 160, 161, 118, 120, 154, 169, 170; 340/347

(56) References Cited

U.S. PATENT DOCUMENTS

| | | | | |
|---|---|---|---|---|
| 4,093,866 A | * | 6/1978 | Kasdan et al. ............... | 250/563 |
| 4,232,302 A | * | 11/1980 | Jagatich ............... | 340/347 AD |
| 4,417,233 A | * | 11/1983 | Inoue et al. .......... | 340/347 AD |
| 4,774,498 A | * | 9/1988 | Traa ........................... | 341/159 |
| 4,990,917 A | * | 2/1991 | Kohdaka .................... | 341/159 |
| 5,519,437 A | * | 5/1996 | Nelvig ........................ | 348/162 |
| 5,790,061 A | * | 8/1998 | Norimatsu .................. | 341/139 |
| 6,078,444 A | * | 6/2000 | Vishakhadatta et al. ...... | 360/32 |
| 6,281,828 B1 | | 8/2001 | Kimura et al. | |

OTHER PUBLICATIONS

Karim Arabi and Bozena Kaminska, "Oscillation Built–in Self Test (OBIST) Scheme for Functional and Structural Testing of Analog and Mixed–Signal Intergrated Circuits," ITC, 1997, paper 31.4, pp. 786ff.

* cited by examiner

Primary Examiner—Brian Young
Assistant Examiner—John Nguyen

(57) ABSTRACT

A method and apparatus converts an analog signal into a quantity N of digital signal representations. The method comprises the step of comparing an amplitude value in the analog signal to a quantity N of reference amplitude values to determine whether the analog value is greater than or less than a reference value, where N is an integer $\leq 1$. The method further comprises the step of producing a logic level in a digital signal corresponding to the determination in the step of comparing. The method essentially converts the analog signal to a time representation and then converts the time representation to a digital representation. The apparatus comprises a quantity N of comparators each connected to receive the analog signal, separately to receive a different one of the N reference values, and to produce the digital signal. The analog signal is reconstructed from the digital representation.

22 Claims, 3 Drawing Sheets

ANALOG TO DIGITAL SIGNAL CONVERSION METHOD AND APPARATUS

TECHNICAL FIELD

The invention relates to processing of analog signals. In particular, the invention relates to the conversion of analog signals into a digital format facilitated by the use of timestamps that denote characteristic signal events.

BACKGROUND ART

Analog signals are commonly used in a wide variety of devices and systems. Many systems employ analog signals to transfer information from one portion of the system to another. A common example of a system or device that uses analog signals is a sensor. In many practical situations encountered in the real world, it is often necessary or at least desirable to transform analog signals into a digital representation. This is especially true in cases where digital methodologies are used largely to process and analyze the analog signals.

For example, most manufacturers of integrated circuits (ICs) employ some form of automated test equipment (ATE) to test the IC products being manufactured. While ATEs are overwhelmingly implemented based on digital technologies, many of the modem ICs that are being manufactured, produce some analog output signals. This is becoming particularly true as modem system-on-a-chip devices are transitioned from the concept to the product phase. The problem for the designers and users of ATEs is how to transform analog signals into a format that can be utilized by the digital ATE.

The conventional approach to transforming an analog signal into a digital representation is to use an analog to digital converter (ADC). Conventional ADCs sample the amplitude of the analog signal or waveform at successive, often regularly spaced, points in time. The sampled amplitude values are converted to a digital format (i.e., digitized) by one of several approaches. Once digitized, the analog signal is represented by a time-sequence of digital values representing the amplitudes sampled by the ADC. Among the commonly employed ADC approaches known in the art are the over-sampling converters, such as the delta-sigma modulator-based ADCs, the successive approximation ADCs, and the so-called flash ADCs. Each of these technologies ultimately produces a string of digital words, each word representing a sampled amplitude value in digital form, in a time sequence at regularly spaced time intervals.

While conventional time-sampled analog to digital conversion can provide high fidelity conversion of analog signals to a digital form, the conventional ADCs can be costly to implement in some instances. In particular, many of the conventional ADC technologies are not well suited for simple, accurate on-chip implementations. This is especially true when considering on-chip conversion of analog signals for built-in-self-test (BIST) purposes or for use in conjunction with an external digital ATE. Similarly, the use of conventional ADC approaches as an interface between an analog device and an ATE can pose many problems, not the least of which is the need for extra dedicated resources in the ATE to accommodate the often high data rate digital signals generated by a conventional time-sampling ADC.

An interesting alternative to the use of conventional ADCs in the testing of devices is the use of so-called Oscillation BIST with frequency measurement. Oscillation BIST methodologies incorporate circuitry into an analog device or circuit such as an amplifier that can be used during test to temporarily 'change' circuitry causing the device to oscillate. Since the oscillation frequency and amplitude characteristics of the circuit under test are directly related to the performance of the circuitry, a determination can often be made based on the oscillations as to whether the device meets its operational requirements. Furthermore, since most ATEs can measure frequency fairly accurately, it is often possible to use a conventional ATE to make the determination. Unfortunately oscillation BIST is applicable to only a fraction of the analog circuits being employed in the modern analog and mixed signal devices, because only one or two values, frequency and an optional voltage of the oscillation, are extracted to judge whether the device under test is operational and meeting specifications. In addition, oscillation BIST can take an unacceptably long time, especially when dealing with circuits with low frequencies and/or long settling times in terms oscillation transients.

Accordingly, it would be advantageous to have a method and apparatus for transforming an analog signal into a digital representation that preserved key characteristics of the analog signal, while minimizing the implementation costs. In addition it would be beneficial if such a method and apparatus could be applied to any analog signal and could be implemented efficiently either on-chip or off-chip. Such a method and apparatus would solve a long-standing need in the area of analog to digital signal conversion, especially as the conversion relates to processing and testing of analog signals by digital systems such as ATEs.

SUMMARY OF THE INVENTION

The present invention is a novel method and apparatus for converting analog signals into a digital representation. The digital representation of the analog signal produced by the method and apparatus of the present invention is based on a time sequence and not on a conventional amplitude sequence. Conventional ADCs produce a sequence of digitized amplitude samples at predetermined times or equivalently at a set of predetermined time events. Unlike conventional ADCs, the method and apparatus of the present invention produces a sequence of digitized time samples at or corresponding to the occurrence of a set of predetermined amplitude events within the analog signal. The present invention essentially maps the analog signal to a series of events and records the time of occurrence of these events. The time record of the occurrence of the events can be thought of as a sequence of timestamps. The timestamp sequence generated for an analog signal by the method and apparatus of the present invention combined with knowledge of the events associated with the timestamp sequence can provide enough information to allow the reconstruction of the signal from the timestamps.

In one aspect of the present invention, a method of converting an analog signal into a quantity N of digital signal representations is provided. In particular, the analog signal may be from a device under test that produces an analog signal at an output or may be a signal internal to the device under test. The method comprises the step of comparing an amplitude of the analog signal to a quantity N of reference amplitudes to determine whether the analog amplitude is greater than or less than each reference amplitude. The quantity N is an integer equal to or greater than 1. The method further comprises the step of producing a first logic level in a digital signal corresponding to when the analog amplitude is greater than a respective reference amplitude. The step of producing further includes producing a second logic level in the corresponding digital signal when the analog amplitude is less than the respective reference amplitude. The steps of producing and comparing are performed until the digital signal comprises representations for a plurality of analog signal amplitude events.

The step of comparing comprises either simultaneously comparing the analog amplitude in the analog signal to the quantity N of reference amplitudes in parallel or sequentially comparing the analog amplitude in the analog signal to each one of the quantity N of reference amplitudes until all of the reference amplitudes have been compared.

In another aspect of the invention, a method of converting an analog signal from a device under test into a digital signal representation is provided. The method comprises the step of comparing an amplitude of the analog signal to a reference amplitude to determine whether the amplitude in the analog signal is greater than or less than the reference amplitude. The method further comprises the step of producing a first logic level in a digital signal when the amplitude is greater than the reference amplitude and a second logic level in the digital signal when the amplitude event is less than the reference amplitude. The method still further comprises the step of repeating the steps of comparing and producing for a period of time to obtain the digital signal representation of a plurality of amplitude events in the analog signal. According to the invention, an amplitude event is a length of time or a time that the amplitude of the analog signal is either greater than or less than the reference amplitude.

In still another aspect of the invention, an apparatus for converting an analog signal into a quantity N of digital signal representations is provided. In particular, the analog signal may be from a device under test that produces an analog signal at an output. The apparatus comprises an apparatus input, a quantity N of comparators and a quantity N of apparatus outputs, where N is an integer equal to or greater than 1. Each comparator has a first input, a second input and an output. The first input of each comparator is connected to the apparatus input and receives an analog amplitude value, wherein the amplitude value varies as a function of time. The second input of each comparator receives a different one of a quantity N of amplitude reference values. Each comparator produces a digital signal at the comparator output. The output of each comparator is connected to a different one of the N apparatus outputs. The apparatus can be implemented as a stand-alone unit or it can be incorporated into a device as part of onboard built-in test circuitry.

In still yet another aspect of the present invention, a system for converting an analog signal into a digital representation is provided. The system comprises an analog to digital conversion apparatus of the present invention. The apparatus has an input that receives and analog signal and a quantity N of apparatus outputs, where N is an integer equal to or greater than 1. The analog signal may be an output signal of a device under test or may be a signal internal to the device under test. The apparatus produces one of a quantity N of digital signals at each apparatus output. The system further comprises a quantity N of transition interval analyzers (TIAs). Each TIA has an input and an output, such that each apparatus output is connected to the input of one TIA. Each TIA encodes timing of logic transitions in a respective digital signal. Optionally, the system further comprises a test system for testing a device under test having a plurality of ports. Each port of the test system is connected to the output of one TIA. The test system uses the encoded timing information in the digital signal from the TIAs as timestamps of events in the analog signal to determine if device under test meets specifications.

BRIEF DESCRIPTION OF THE DRAWINGS

The various features and advantages of the present invention may be more readily understood with reference to the following detailed description taken in conjunction with the accompanying drawings, where like reference numerals designate like structural elements, and in which.

MODES FOR CARRYING OUT THE INVENTION

The present invention is a novel method and apparatus of converting an analog signal into a digital representation. In addition, the method and apparatus of the present invention facilitate testing a device under test (DUT) that generates an analog output signal. The digital representation generated by the method and apparatus of the present invention records the time of occurrence of a plurality of amplitude events within the analog signal. As such, the digital representation of the amplitude events can be viewed as an analog timestamp representation of the analog signal. Alternately, the method and apparatus of the present invention can be said to produce time samples or timestamps of the analog signal at a set of predetermined amplitude events. The timestamps can be used to reconstruct a sampled analog signal from the timestamp representation and/or the timestamps can be used to test an analog signal of a DUT. Such testing of a DUT can include, but is not limited to, pass/fail testing and/or analog characteristic testing based on device specifications and signature analysis. The term 'signature analysis' as used herein refers to comparing timestamps produced for the DUT to equivalent timestamps produced for a device that is known to be a 'good device '.

An analog signal S is defined for the purposes of discussion herein as a signal having an amplitude v(t) that varies or takes on different, non-discrete values as a function of time. Preferably, the analog signal has a time-varying signal amplitude v(t) that can be described by a continuous function of time. More preferably, the time-varying signal amplitude v(t) can be described by a smooth, continuous function of time. The term 'smooth ' as used herein with reference to a function of time means that at least the first derivative with respect to time of the function describing the time-varying signal amplitude v(t) exists and is defined for all time t greater than zero but less than a maximum time $T_{max}$.

Figure 1:
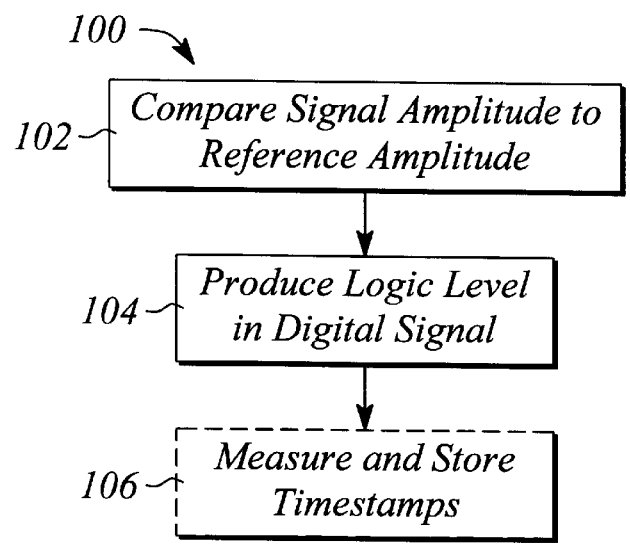
FIG. 1 illustrates a flow chart of a method of converting an analog signal into a digital signal using analog to time conversion of the present invention.

In one aspect of the invention, a method of converting 100 an analog signal S into a digital signal representation is provided. FIG. 1 illustrates a flow chart of the method of converting 100 of the present invention. The method of converting 100 comprises the step of comparing 102 the amplitude v(t) of the analog signal S to a reference amplitude Vr. During the step of comparing 102, a determination is made as to whether the signal amplitude v(t) is either greater than, less than, or equal to the reference amplitude Vr. Essentially, the step of comparing 102 can be viewed as a conversion of the analog signal to a time representation where the time is the time of occurrence of a reference amplitude Vr crossing event.

The method of converting 100 further comprises the step of producing 104 a logic level in an output digital signal D. The digital signal D is a time-varying signal having an amplitude d(t) that can take on only one of two allowed logic states or levels at any given point in time t. During the step of producing 104, a first one of the logic levels is produced 104 in the output digital signal D when the analog amplitude v(t) is greater than the reference amplitude Vr and a second one of the logic levels is produced 104 in the output digital signal D when the analog signal amplitude v(t) is less than the reference amplitude Vr. The steps of comparing 102 and producing 104 are repeated for all time t less than the maximum time $T_{max}$. Essentially, the step of producing 104 can be viewed as a conversion from a time representation to a digital representation.

Note that, since the analog signal amplitude v(t) is described by a continuous function of time t, the amplitude d(t) of the digital signal D can likewise be described by a continuous function of time t. Moreover, if it is assumed that the analog signal amplitude v(t) sometimes exceeds the reference amplitude Vr, while at other times it does not exceed the reference amplitude Vr, the digital signal amplitude d(t) will spend a portion of time t at the first logic level and another portion of time t at the second logic level. Furthermore, the points in time t at which the digital signal amplitude d(t) transitions between logic states will correspond to points in time t when the analog signal amplitude v(t) either changes from being greater than to less than the reference amplitude Vr or changes from being less than to greater than the reference amplitude Vr. Thus, as result of the application of the method of converting 100 of the present invention, a logic transition is induced in the digital signal D at a time t that corresponds to the time when the analog signal amplitude v(t) crosses the reference amplitude Vr level.

The method 100 further comprises the optional step of measuring and storing 106 timestamps for the logic transitions in the digital signal D. The optional step 106 is illustrated as a dashed-line box in FIG. 1 for that reason. The optional step of measuring and storing measures the time of occurrence of a logic transition and encodes the time of occurrence t in a format suitable for storing in a computer memory. The encoded time of occurrence of a transition is a timestamp. A preferred encoding is a digital encoding based on a timing clock. The encoded time of occurrence t is then stored in a memory such as a computer memory. The optional step of measuring and storing 106 is repeated for each logic transition in the digital signal D.

Figure 2:
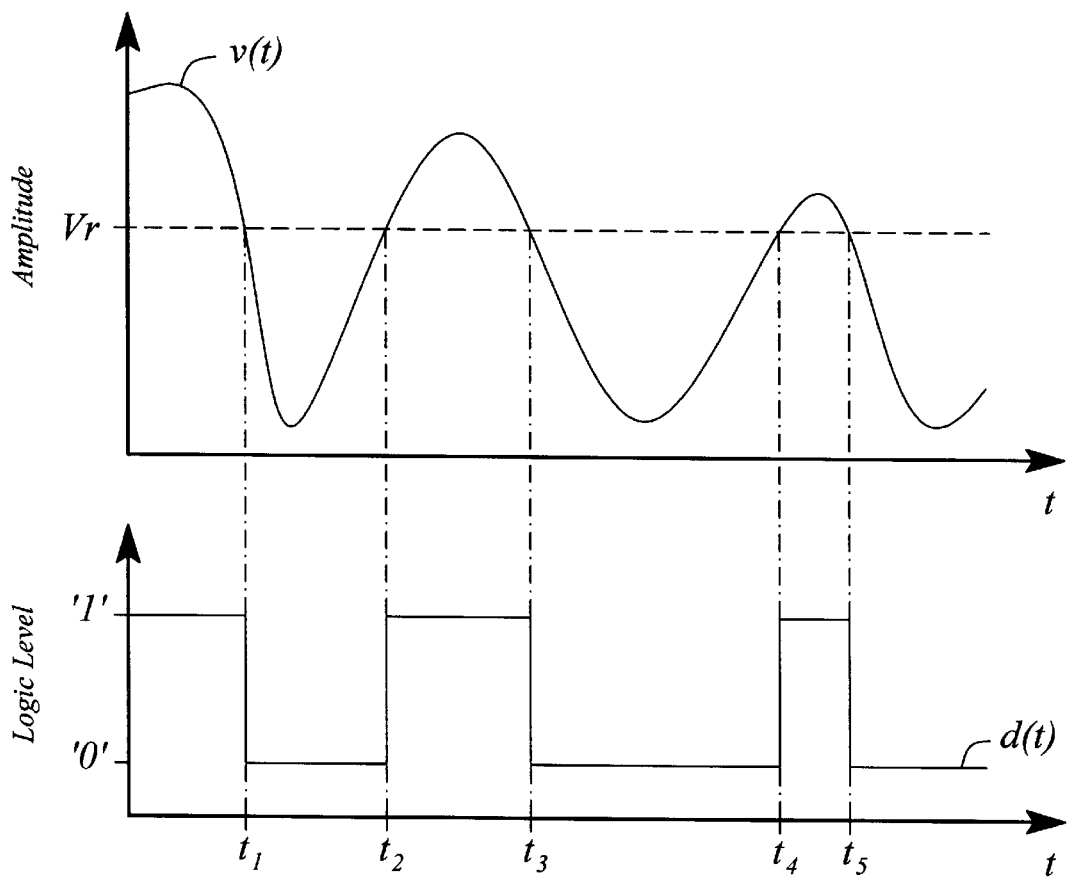
FIG. 2 illustrates a graphical representation of the analog to time conversion of an analog signal into a digital signal according to the method illustrated in FIG. 1.

Consider the example illustrated in FIG. 2. As illustrated in FIG. 2, the time-varying analog signal v(t) repeatedly exceeds and then is less than the reference amplitude Vr. Assume for this example that, if during the step of comparing 102 it is determined that the analog signal amplitude v(t) is greater than the reference amplitude Vr, a logic '1' (e.g. d(t)=1) will be produced by the step of producing 104 in the output digital signal D. On the other hand, if it is determined during the step of comparing 102 that the analog signal amplitude v(t) is less than the reference amplitude Vr, a logic '0' (e.g. d(t)=0) will be produced by the step of producing 104 in the output digital signal D. The results of the application of the method of converting 100 to the analog signal amplitude v(t) are illustrated in FIG. 2 as digital signal D, which has a logic transition that occurs every time the analog signal amplitude crosses the level of the reference amplitude Vr. The correspondence between the timing of transitions in the digital signal D and the point where the analog signal amplitude v(t) crosses the reference amplitude Vr level is indicated by the vertical 'dash-dot' lines in FIG. 2 for convenience of illustration.

The choice of which of the two logic values is used to indicate that the analog signal amplitude v(t) exceeds the reference amplitude Vr is completely arbitrary according to the invention. The example illustrated in FIG. 2 could just as easily have used a logic '0' to indicate that the signal amplitude v(t) was greater than reference amplitude Vr and a logic '1' to indicate that the signal amplitude v(t) was less than the reference amplitude Vr and still be within the scope of the invention. Likewise, when the analog signal amplitude v(t) and the reference amplitude Vr are equal, the effect on the logic state of the digital signal D can be defined arbitrarily to suit a particular application. For example, the case of equality can be arbitrarily defined to produce 104 in the digital signal D one of the two logic states. Alternatively, the case of equality can be left to have an undefined effect on the logic state of the digital signal D. One skilled in the art would readily be able to determine such a definition to suit a particular application. All such definitions are within the scope of the invention. Moreover, the reference amplitude Vr can be either fixed at a particular value or variable and under the control of an external controller and still be within the scope of the invention.

Figure 3:
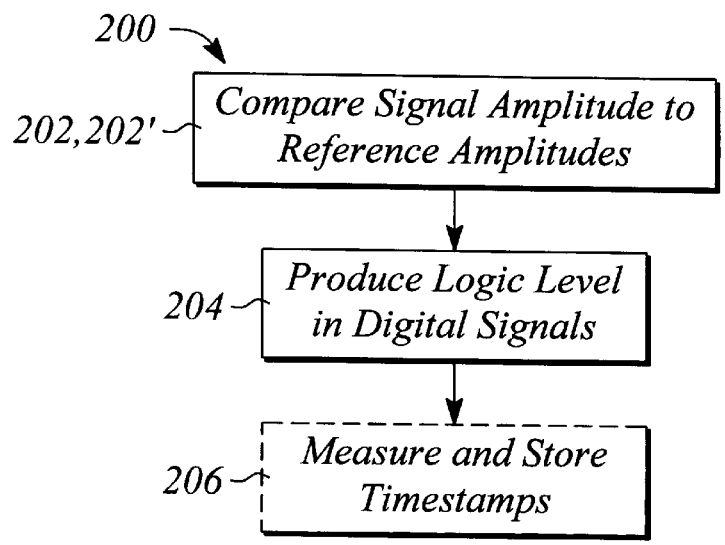
FIG. 3 illustrates a flow chart of a method of converting an analog signal into a plurality of digital signals of the present invention.

In another aspect of the present invention, a method of converting 200 an analog signal S into a plurality of digital signals $D_i$ is provided, where i=1, ..., N and N is an integer greater than or equal to two. In the method of converting 200, a plurality of digital signals $D_i$ is produced by comparing the analog signal S to a plurality of different reference amplitudes $Vr_i$. A flow chart of the method of converting 200 of the present invention is illustrated in FIG. 3.

The method of converting 200 comprises the step of comparing 202 the amplitude v(t) of the analog signal S to the N reference amplitudes $Vr_i$. The comparisons 202 may either be done in parallel by simultaneously comparing 202 the signal amplitude v(t) to all N of the reference amplitudes $Vr_i$ or sequentially by comparing 202' the signal amplitude v(t) to a first reference amplitude $Vr_1$ followed by comparing 202' the signal amplitude v(t) to a second reference amplitude $Vr_2$ and so on, until the signal amplitude v(t) has been compared to the N-th reference amplitude $Vr_N$. During the step of the comparing 202, 202' a determination is made as to whether the signal amplitude v(t) is either greater than, less than, or equal to each of the reference amplitudes $Vr_i$. As with step 102 of method 100, the step of comparing 202, 202' can be viewed as a conversion of the analog signal to a time representation.

The method of converting 200 further comprises a step of producing 204 a logic level in each of the plurality of digital signals $D_i$. Each of the plurality of digital signals $D_i$ is a time-varying signal having an amplitude $d_i(t)$ that can take on only one of two allowed logic states or levels at any given point in time t. During the step of producing 204, a first one of the logic levels is produced 204 in the i-th output digital signal $D_i$ when the analog amplitude v(t) is greater than the i-th reference amplitude $Vr_i$ and a second one of the logic levels is produced 104 in the i-th output digital signal $D_i$ when the analog signal amplitude v(t) is less than the i-th reference amplitude $Vr_i$. The method of converting 200 produces 204 the i-th digital signal $D_i$ with the amplitude $d_i(t)$ exhibiting one of the two allowed logic levels, wherein the time t, during which a first logic level is present, is proportional to a length of time that amplitude v(t) is greater than the ith reference amplitude $Vr_i$. Moreover, the timing of transitions between the first and the second logic level in the i-th digital signal amplitude $d_i(t)$ corresponds to the timing of the amplitude v(t) crossing the level of the i-th reference amplitude $Vr_i$. As with step 104 of method 100, the step of producing 204 can be viewed as a conversion from a time representation to a digital representation.

The method 200 further comprises the optional step of measuring and storing 206 timestamps for the logic transitions in the digital signals $D_i$. The optional step 206 is illustrated as a dashed-line box in FIG. 3 for that reason. The optional step of measuring and storing 206 measures the time of occurrence of a logic transition and encodes a time of occurrence $t_i$ of an i-th transition event in a format suitable for storing in a computer memory. Each encoded time of occurrence is a timestamp. A preferred encoding is a digital encoding based on a timing clock. The encoded time of occurrence $t_i$ is then stored in a memory. The optional step of measuring and storing is repeated for each logic transition in each of the digital signals $D_i$. In general, there is a timestamp stored for every transition in each of the digital signals $D_i$ in the optional step of measuring and storing 206.

Figure 4:
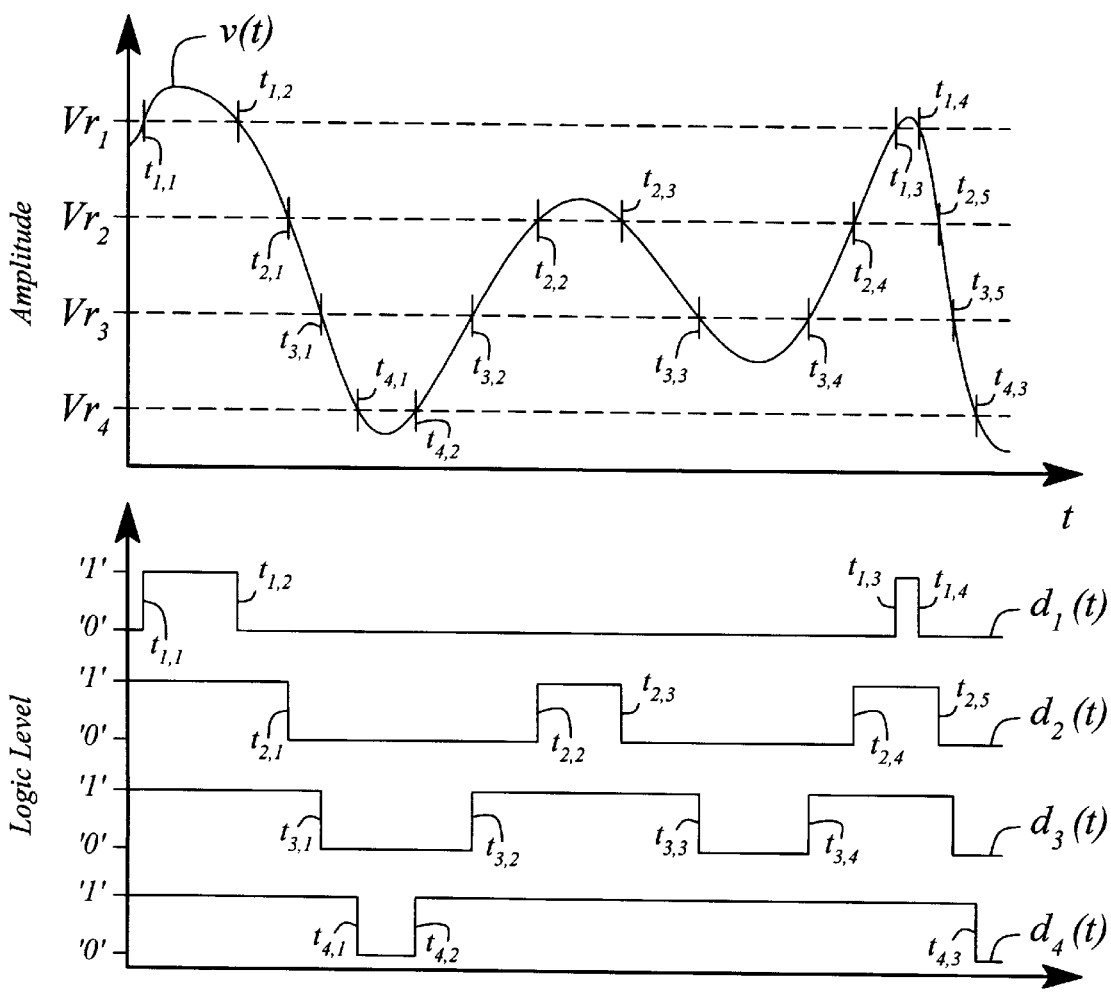
FIG. 4 illustrates a graphical representation of the conversion of an analog signal into a plurality of digital signals according to the method illustrated in FIG. 3.

FIG. 4 illustrates an example of the application of the method of converting 200 to an analog signal S. For illustrative purposes only in the example illustrated in FIG. 4, it is assumed that N=4 and that a logic '1' in the i-th digital signal $D_i$ is associated with the signal amplitude v(t) being greater than the i-th reference amplitude $Vr_i$. Thus, there are four reference amplitudes $Vr_1$, $Vr_2$, $Vr_3$, and $Vr_4$, and there are four digital signals $D_1$, $D_2$, $D_3$, and $D_4$. The analog signal amplitude v(t) is illustrated in an upper portion of FIG. 4 while a plot of the digital signals $D_1$, $D_2$, $D_3$, and $D_4$ is illustrated in the lower portion of FIG. 4. The digital signals $D_1$, $D_2$, $D_3$, and $D_4$ each range between logic levels of '0' and '1' and are labeled in FIG. 4 as $d_1(t)$, $d_2(t)$, $d_3(t)$ and $d_4(t)$, respectively.

Referring to FIG. 4, the times t when the analog signal amplitude v(t) crosses a given reference amplitude $Vr_i$ are labeled as $t_{j,k}$ where the first subscript j denotes the reference amplitude number and the second subscript k counts the number of crossings since the signal S began. For example, the signal amplitude v(t) crosses the reference amplitude $Vr_2$ at a time $t=t_{2,1}$. At or immediately after the time $t=t_{2,1}$, the step of comparing 202 determines that the signal amplitude v(t) that was greater than the reference amplitude $Vr_2$ is now less than the reference amplitude $Vr_2$. The step of producing 204 then changes the logic level of the second digital signal $D_2$ from '1' to '0'. Thus, the transition labeled $t_{2,1}$ in the second digital signal $D_2$ (labeled $d_2(t)$ in FIG. 4) occurs at a time t that is related to the $Vr_2$ crossover time of the analog signal amplitude v(t). At another point in time $t=t_{3,2}$, the amplitude v(t) crosses the reference amplitude $Vr_3$. The step of comparing 202 determines that the signal amplitude v(t) is now greater than the reference amplitude $Vr_3$ and the step of producing 204 changes the logic level of the third digital signal $D_3$ (labeled $d_3(t)$ in FIG. 4) from '0' to '1'. As a result of the application of the steps of comparing 202 and producing 204 of the method 200 to the analog signal S, the digital signals $D_1$, $D_2$, $D_3$, and $D_4$ have logic transitions which correspond in time to the points in time when the signal amplitude v(t) crosses each of the reference amplitudes $Vr_1$, $Vr_2$, $Vr_3$, and $Vr_4$. As with method 100, these points in time related to the signal S are readily defined and can be considered to be 'events' in the analog signal S in the method 200.

As alluded to hereinabove, the method 100, 200 of the present invention can be viewed as a method of analog to digital conversion that first converts the analog signal to a time representation and then converts the time representation to a digital signal representation. The method 100 represents the embodiment where the number of digital representations N=1. The method 200 extends the method 100 to where preferably N≧2 and thus provides more information about the analog signal S in the digital representations. The time representation is the timing associated with a reference amplitude $Vr_i$ crossing events in the step of comparing 102, 202. The digital representation is the plurality of digital signals $D_i$. The time representation is encoded in the digital signals $D_i$ as the time of occurrence of the produced 104, 204 logic transitions. As an analog to digital conversion, the results of the method 100, 200 can contain enough information to reconstruct the analog signal from the digital representation on provided the sampling is performed with sufficient resolution. One skilled in the art would readily be able to determine a sufficient resolution for reconstructing a given signal based on a Nyquist Criteria, well known to those skilled in the art, without undue experimentation. Alternatively, the analog to digital conversion of the method 100, 200 of the present invention can be used to perform pass/fail testing and/or related analog characteristic analysis of a DUT based on device specification or to perform signature analysis of an analog signal in a DUT.

Figure 5:
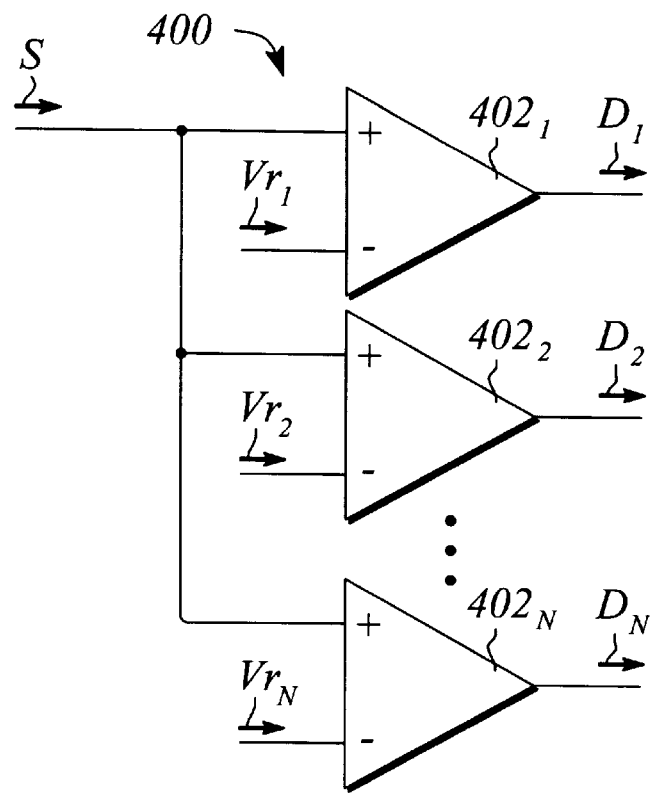
FIG. 5 illustrates a block diagram of one embodiment of an analog to digital conversion apparatus of the present invention.

In yet another aspect of the invention, an analog to digital conversion apparatus 400 is provided. The conversion apparatus 400 accepts an analog signal S and converts the analog signal S into one or more digital signals $D_i$, where i=1, . . . , N and N is greater than or equal to 1. A block diagram of the conversion apparatus 400 is illustrated in FIG. 5. The conversion apparatus 400 comprises one or more comparators $402_i$, having a first input, a second input and an output. In the block diagram illustrated in FIG. 5, the preferred embodiment of more than one comparator $402_i$ is shown by way of example only. The first input of each comparator $402_i$ is labeled '+' and the second input is labeled '−'. The comparator $402_i$ is a device known in the art that compares the amplitudes of signals on its inputs and produces an output signal on its output, the level of the output signal being determined by relative values of the signals on the inputs. By convention, if a signal amplitude applied to the first input '+' is larger than the signal amplitude applied to the second '−' input, the output of a comparator is 'high'. The apparatus 400 essentially implements the method 100, 200 of the present invention.

For example, an operational amplifier can be used as a comparator $402_i$ for the apparatus 400 of the invention. An operational amplifier is a device that produces an output voltage that is the amplified difference between a voltage applied to a first input terminal and a voltage applied to a second input terminal. Typical operational amplifiers have very large scale or gain factors that multiply or exaggerate the difference. Thus, if a voltage $V_1$ is applied to the first terminal of an operational amplifier and a second voltage $V_2$ that is less than $V_1$ is applied to the second terminal, the output will be a large value $V_{out}=G \cdot (V_1-V_2)$, where G is an open loop gain of the operational amplifier. Generally, the value $V_{out}$ will be observed to swing between two voltages determined by the power supply voltages applied to the operational amplifier for very small differences in the voltages $V_1$ and $V_2$. This is exactly what is desired for the one or more comparators $402_i$ of the invention. If the voltage $V_1$ is related to the signal amplitude v(t) and the voltage $V_2$ is related to one of the reference amplitudes Vr, then the operational amplifier will provide the desired comparator function for the apparatus 400. One skilled in the art will readily recognize that there are other suitable approaches for implementing the one or more comparators $402_i$. All such suitable approaches are within the scope of the present invention.

Referring again to FIG. 5, the analog signal S is applied to the first input of each of the comparators $402_i$. A first reference amplitude $Vr_1$ is applied to the second input of the first comparator $402_1$. A second reference amplitude $Vr_2$ is applied to the second input of the second comparator $402_2$, and so on, until an N-th reference amplitude $Vr_N$ is applied to a second input of the N-th comparator $402_N$. An output signal generated by the first comparator $402_1$ is the first digital signal $D_i$. An output signal generated by the second comparator $402_2$ is the second digital $D_2$, and so on, until an output signal generated by the N-th comparator $402_N$ is the N-th digital signal $D_N$. The digital signal $D_i$ comprises a digital representation on or format of the analog signal S.

Figure 6:
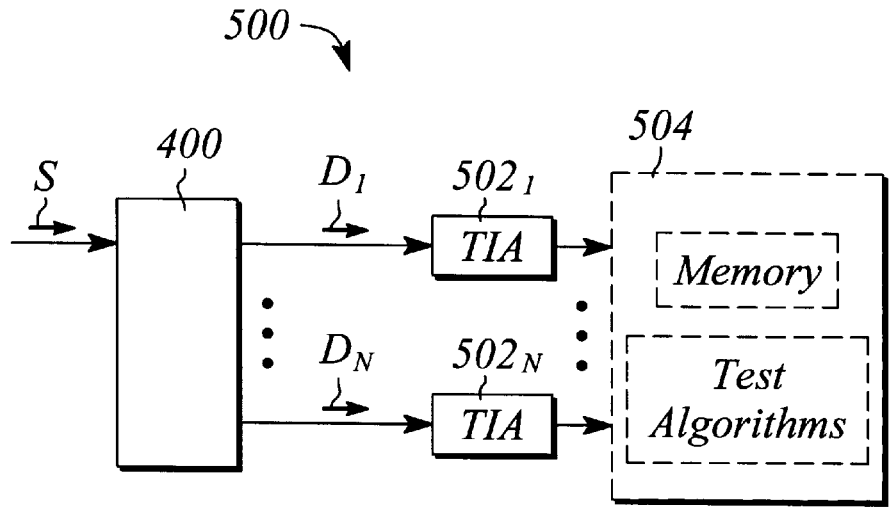
FIG. 6 illustrates a block diagram of a system for testing a device under test using the analog to digital conversion apparatus of the present invention.

In yet another aspect of the invention, a system 500 for converting an analog signal S is provided. Such a system may be used to convert an analog output signal from a device under test (DUT). FIG. 6 illustrates a block diagram of the conversion system 500 of the present invention. The conversion system 500 comprises an analog to digital conversion apparatus 400 of the present invention that receives the analog input signal S. The conversion apparatus converts the signal S into one or more of digital signals $D_i$, where i=1, . . . , N and N is greater than or equal to 1. As noted hereinabove, the conversion performed by the apparatus 400 essentially encodes the timing of certain predefined amplitude events as transitions in the digital signals $D_i$.

The system 500 further comprises one or more of a transition interval analyzer (TIA) $502_i$, one TIA $502_i$ for each digital signal $D_i$ produced by the conversion apparatus 400. The TIA $502_i$ is a device known in the art that measures the time of occurrence of logic transitions in the digital signals $D_i$. Further, TIAs $502_i$ are well known in the art of testing DUTs.

The system further comprises an optional test equipment 504. The optional test equipment 504 is illustrated as a dashed-line box in FIG. 6 for that reason. The optional test equipment 504 may be, for example, an automated test equipment (ATE) system or a similar test system. The test equipment 504 has one or more ports that are connected to the output of a different one of the TIAs $502_i$. Each of the TIAs $502_i$ generates a sequence of digital words that encode the timing of the transitions in the respective digital signals $D_i$. The optional test equipment 504 comprises an optional memory for storing the timestamps and an optional test algorithm for analyzing the timestamps. For example, the optional test equipment 504 might use the encoded timing information of the timestamps to recognize and analyze events in the analog signal S. In one application, the analysis may be used to determine if a DUT meets a specification associated with the events encoded by the digital signals $D_i$. In general, the test equipment 504 stores the timestamps in memory and compares them using a test algorithm to expected timestamps or equivalent timing information. The comparison performed by the ATE 504 with the test algorithm can then be used for example, to assess the 'pass/fail' condition of the DUT based on specification for the DUT or to perform signature analysis using expected timestamps produced from a known good device. One skilled in the art would readily be able to choose and configure a TIA $502_i$ for a given ATE 504 and develop a test algorithm that would be suitable for the testing system 500 of the present invention without undue experimentation.

The system 500 excluding the optional test equipment 504 can be implemented as a stand-alone element. For example, the system 500 can be implemented as a DUT test board that interfaces a DUT to an external ATE system. The system 500 can be integrated into a DUT as part of the DUTs on board test circuitry. Further, the system 500 can be integrated into an ATE. In a preferred embodiment, the system 500 is integrated into a device (e.g. DUT) as part of the device's built-in test circuitry. More preferably, only the apparatus 400 is built into the device. When only the apparatus 400 is built-in, the TIAs $502_i$ and optional test equipment 504 including the optional memory/algorithms are typically part of an external test system used to test the device such as an ATE. In other words, the apparatus can be implemented either off-chip or preferably on-chip with respect to the device.

Thus, there have been described novel methods 100, 200 for converting an analog signal to one or more digital signals. Furthermore, there has been described a novel analog to digital conversion apparatus 400 and a system 500 for converting an analog signal that utilizes the conversion apparatus 400. It should be understood that the above-described embodiments are merely illustrative of the some of the many specific embodiments that represent the principles of the present invention. Clearly, those skilled in the art can readily devise numerous other arrangements without departing from the scope of the present invention.

What is claimed is:

1. A method of converting an analog signal into a quantity N of digital signal representations comprising the steps of:
   comparing an amplitude of the analog signal to a quantity N of reference amplitudes to determine whether the analog amplitude is greater than or less than each reference amplitude, where N is an integer equal to or greater than 1;
   producing a first logic level in a digital signal corresponding to a respective one of the reference amplitudes when the analog amplitude is greater than the respective reference amplitude and a second logic level in the corresponding digital signal when the analog amplitude is less than the respective reference amplitude until each digital signal comprise representation for a plurality of analog signal amplitude events, the representations being a set of timestamps that corresponds to the plurality of amplitude events.

2. The method of claim 1, further comprising the step of measuring and storing a timestamp for each logic level transition in the digital signal.

3. The method of claim 1, wherein the step of comparing comprises simultaneously comparing the analog amplitude in the analog signal to the quantity N of reference amplitudes in parallel.

4. The method of claim 1, wherein the step of comparing comprises sequentially comparing the analog amplitude in the analog signal to each one of the quantity N of reference amplitudes until all of the reference amplitudes have been compared.

5. The method of claim 1, wherein the first logic level is present on the corresponding digital signal for a period of time proportional to a length of time that the amplitude of the analog signal is greater than the respective reference amplitude.

6. The method of claim 1, wherein each time the first logic level or the second logic level transitions in the corresponding digital signal corresponds to an event time that the amplitude of the analog signal crosses the respective reference amplitude.

7. A method of converting an analog signal from a device under test into a digital signal representation on comprising the steps of:
   comparing an amplitude of the analog signal to a reference amplitude to determine whether the amplitude in the analog signal is greater than or less than the reference amplitude;
   producing a first logic level in a digital signal when the amplitude is greater than the reference amplitude and a second logic level in the digital signal when the amplitude is less than the reference amplitude; and
   repeating the steps of comparing and producing for a period of time to obtain the digital signal representation on of a plurality of amplitude events in the analog signal, the representation on being a set of timestamps tat corresponds to the plurality of amplitude events.

8. The method of claim 7, further comprising the step of measuring and recording a timestamp for each logic level transition in the digital signal.

9. The method of claim 7, wherein the amplitude event comprises a length of time that the amplitude of the analog signal is either greater than or less than the reference amplitude.

10. The method of claim 7, wherein in the step of producing, the first logic level and the second logic level are present on the digital signal for a period of time proportional to a length of time that the amplitude of the analog signal is greater than and less than the reference amplitude, respectively.

11. The method of claim 7, wherein in the step of producing, each time the first logic level and the second logic level transitions in the digital signal corresponds to a crossover time that the amplitude of the analog signal crosses the reference amplitude.

12. An apparatus for converting an analog signal having an amplitude value to a quantity N of digital signals comprising:
    an apparatus input;
    a quantity N of comparators each having a first input, a second input and an output, where N is an integer equal to or greater than 1, the first input being connected to the apparatus input and receiving the amplitude value, wherein the amplitude value varies as a function of time, the second input being connected to receive a different one of a quantity N of reference values, and each comparator producing a respective one of the N digital signals at the comparator output; and
    a quantity N of apparatus outputs, wherein each comparator output is connected to a different one of the N apparatus outputs, and wherein each digital signal comprises a set of timestamps, each timestamp in the set corresponding to a time when the amplitude value is either greater than or less than a respective reference value.

13. The apparatus of claim 12, wherein when N is greater than 1, the comparators simultaneously compare the analog signal amplitude to the different reference values in parallel.

14. The apparatus of claim 12, wherein when N is greater than 1, each comparator sequentially compares the analog signal amplitude to the different reference value.

15. The apparatus of claim 12, wherein the comparator is an operational amplifier.

16. A system for converting an analog signal into a digital representation on comprising:
    an analog to digital conversion apparatus having an input connected to receive the analog signal, and a quantity N of apparatus outputs, where N is an integer equal to or greater than 1, the apparatus producing one of a quantity N of digital signals at each apparatus output;
    a quantity N transition interval analyzers (TIA) each having an input and an output, each apparatus output being connected to the input of a respective TIA, each TIA encoding timing of logic transitions in a respective digital signal.

17. The system of claim 16, further comprising a test subsystem for testing a device under test, wherein the device under test produces the analog signal, the test subsystem having a plurality of ports, each port connected to the output of a respective TIA, the test subsystem using encoded timing information in each digital signal as timestamps of events in the analog signal to determine if the device under test meets specifications.

18. The system of claim 16, wherein the analog to digital conversion apparatus comprises a quantity N of comparators each having a first input, a second input and an output, the first input being connected to the apparatus input and receiving an analog value of the analog signal, wherein the analog value varies as a function of time, the second input receives a different one of a quantity N of reference values, and each comparator produces a respective one of the digital signals on the comparator output, the comparator output being connected to a respective apparatus output, wherein each digital signal comprises a set of timestamps, each timestamp in the set corresponding to a time when the analog value is either greater than or less than a respective reference value.

19. The system of claim 17, wherein the test subsystem comprises a memory and a test algorithm, wherein the memory stores device specifications and the analog signal timestamps, and wherein the test algorithm compares the analog signal timestamps to expected timestamps derived from the device specifications or from a measurement of a known good device to assess the operational performance of the device under test.

20. The method of claim 1, wherein the digital signal representations are used to reconstruct the analog signal.

21. The method of claim 7, wherein the digital signal representations is used to determine if the device under test meets specifications.

22. The method of claim 7, wherein the digital signal representation is used to perform signature analysis of the device under test.

* * * * *